United States Patent [19]
Fujii et al.

[11] Patent Number: 4,994,687
[45] Date of Patent: Feb. 19, 1991

[54] RETRIGGERABLE MULTIVIBRATOR

[75] Inventors: Shinji Fujii; Ikuo Tsuchiya; Kazuhiko Kasai, all of Yokohama, Japan

[73] Assignee: Kabushiki Kaisha Toshiba, Kawasaki, Japan

[21] Appl. No.: 277,112

[22] Filed: Nov. 29, 1988

[30] Foreign Application Priority Data

Nov. 30, 1987 [JP] Japan ................. 62-302698

[51] Int. Cl.⁵ .................................. H03K 3/29
[52] U.S. Cl. .................................. 307/291; 307/273; 307/593; 307/265; 307/267; 307/268; 307/601; 307/602
[58] Field of Search ............ 307/273, 272.1, 290, 307/291, 593, 265, 267, 268, 601, 602; 328/207, 55

[56] References Cited

U.S. PATENT DOCUMENTS

| | | | |
|---|---|---|---|
| 3,735,270 | 5/1973 | Holub | 307/268 |
| 3,950,654 | 4/1976 | Broedner et al. | 307/593 |
| 3,999,085 | 12/1976 | Kelly et al. | 307/247 A |
| 4,504,749 | 3/1985 | Yoshida | 307/590 |
| 4,623,846 | 11/1986 | LaMacchia | 328/61 |
| 4,628,355 | 12/1986 | Ogura et al. | 358/111 |
| 4,636,954 | 1/1987 | Komatsu et al. | 364/414 |
| 4,710,653 | 12/1987 | Yee | 307/602 |
| 4,741,006 | 4/1988 | Yamaguchi et al. | 377/126 |
| 4,748,597 | 5/1988 | Saito et al. | 365/230 |
| 4,754,163 | 6/1988 | Aue et al. | 307/265 |
| 4,800,295 | 1/1989 | Minuhin et al. | 307/273 |
| 4,922,141 | 5/1990 | Lofgren et al. | 307/602 |

Primary Examiner—Stanley D. Miller
Assistant Examiner—T. Cunningham
Attorney, Agent, or Firm—Finnegan, Henderson, Farabow, Garrett, and Dunner

[57] ABSTRACT

A retriggerable multivibrator is disclosed which comprises a first delay circuit connected for delaying an input signal a predetermined time, a second delay circuit connected to receive an output of the first delay circuit and having a enable or disable function, a flip-flop circuit connected to be set or reset in accordance with an input signal and output signal from the second delay circuit, and a control circuit for detecting a subsequent input signal within a predetermined delay time to enable or disable the second delay circuit.

12 Claims, 8 Drawing Sheets

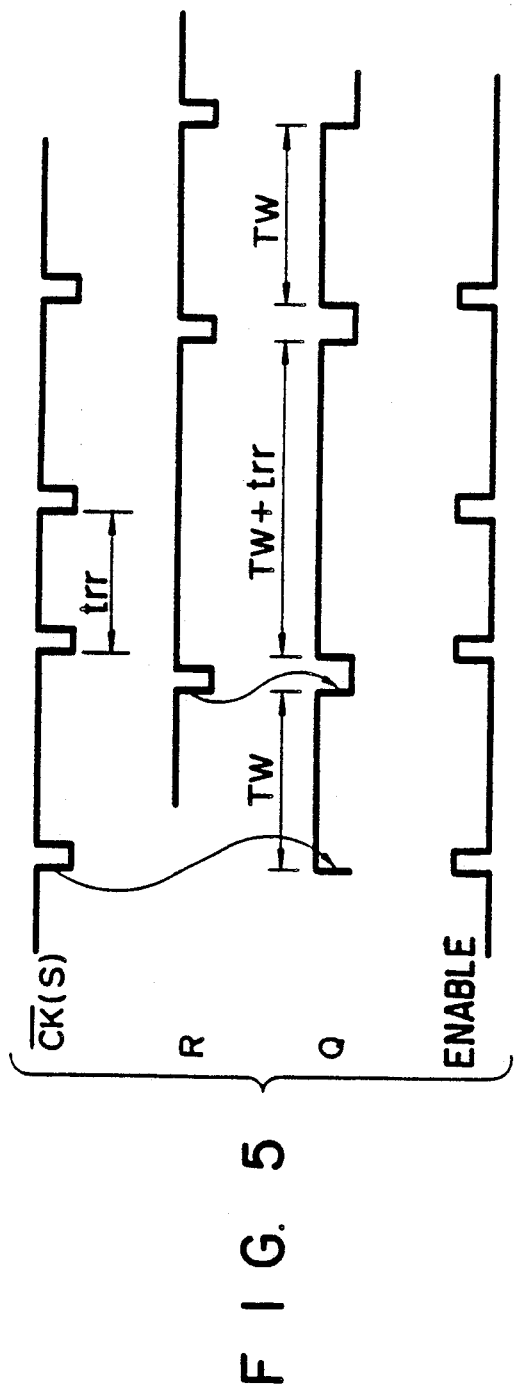
F I G. 5
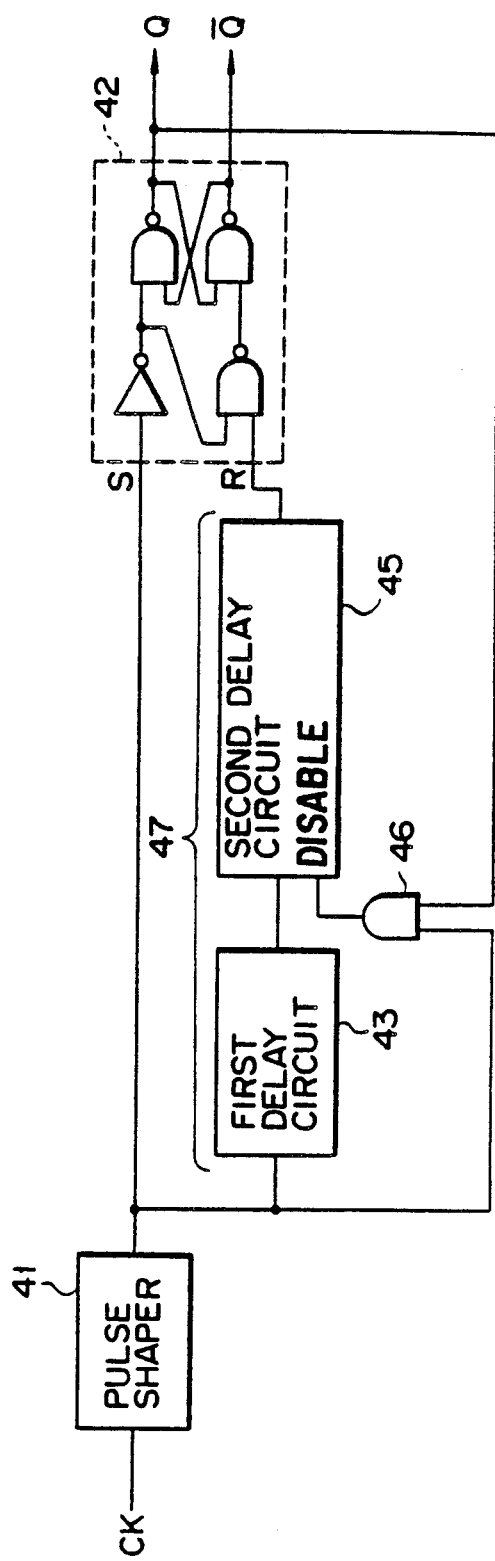
F I G. 6

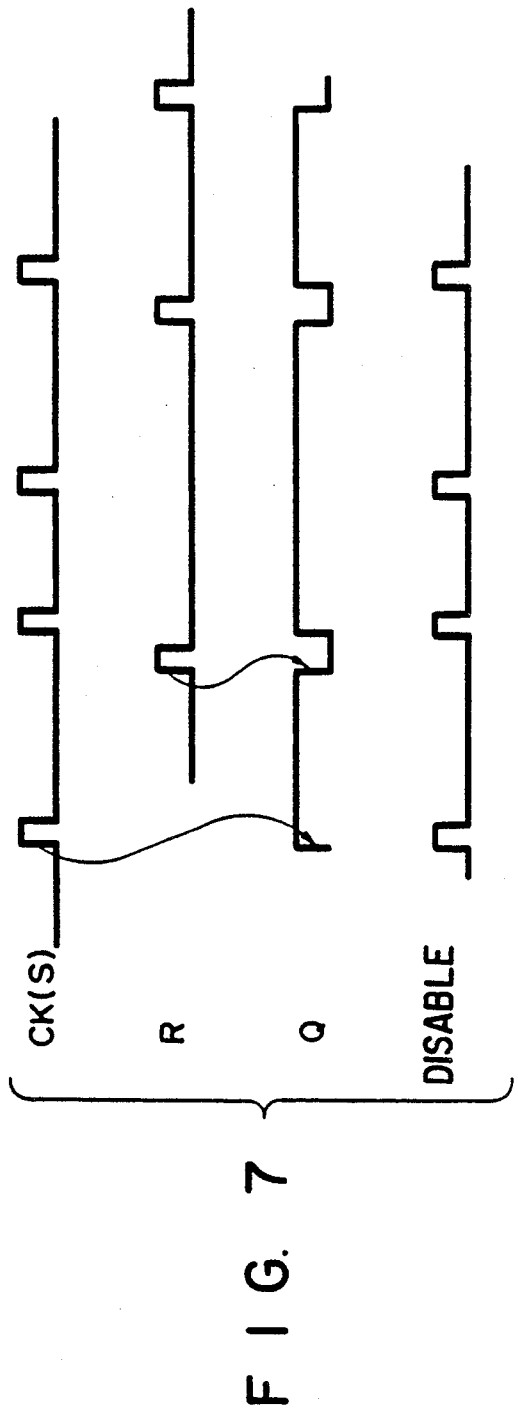
F I G. 7
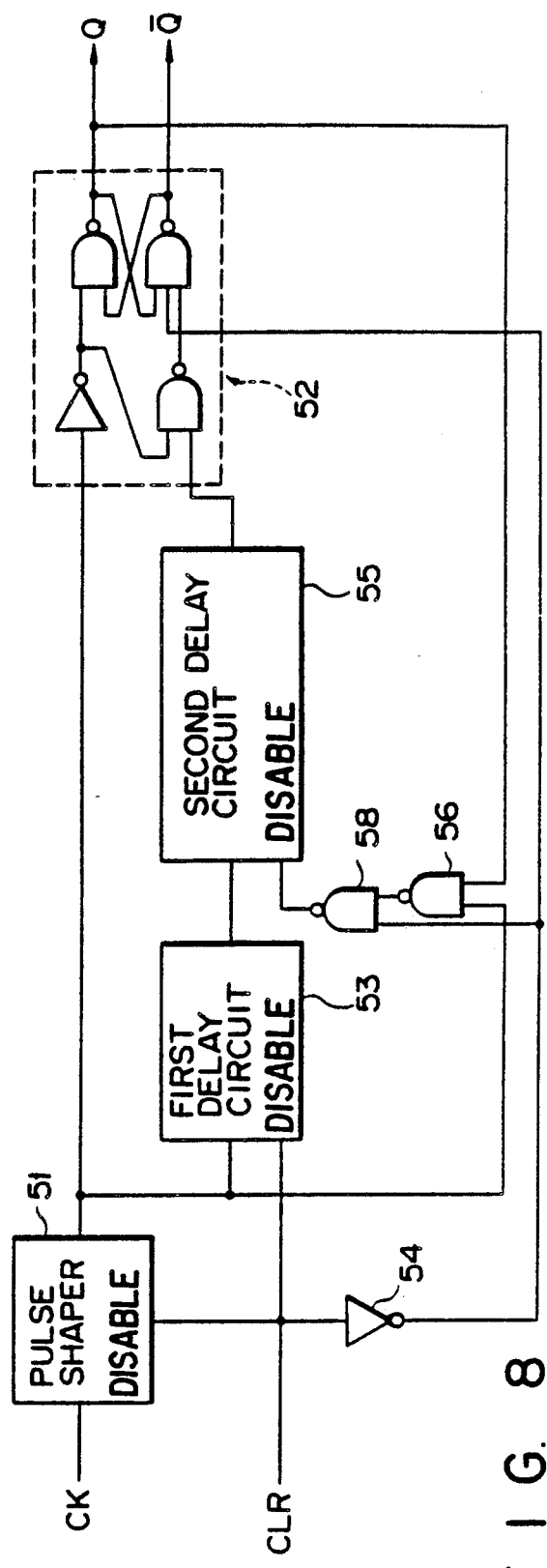
F I G. 8

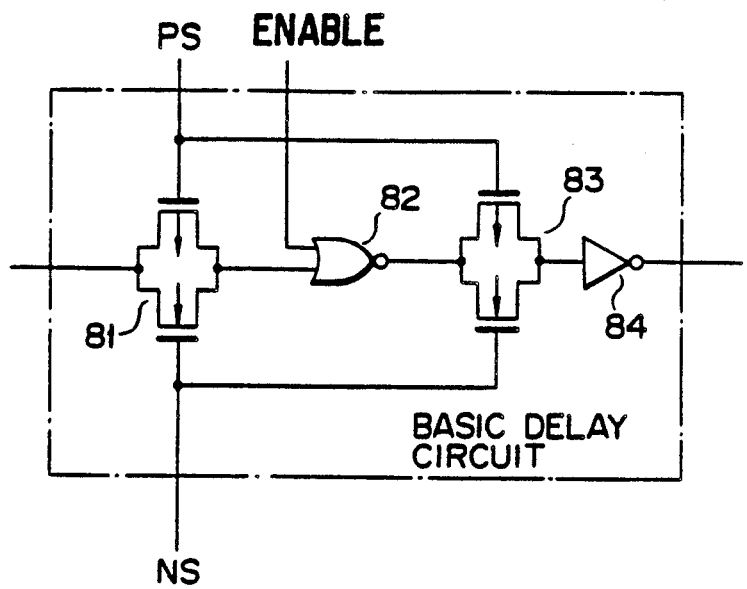
F I G. 10
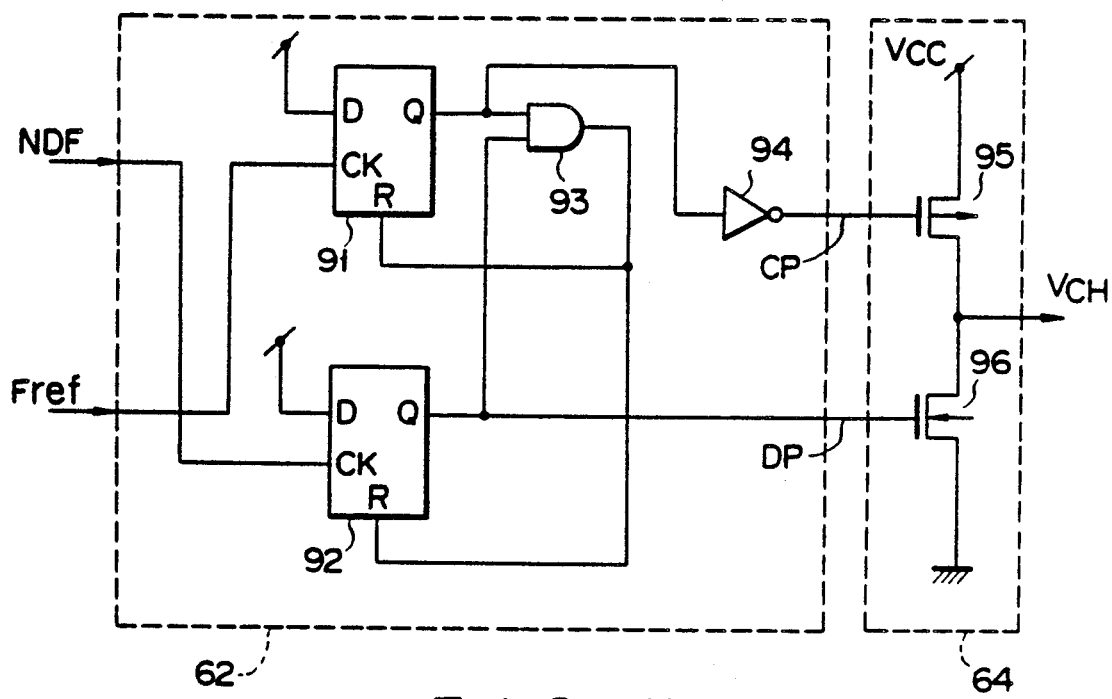
F I G. 11

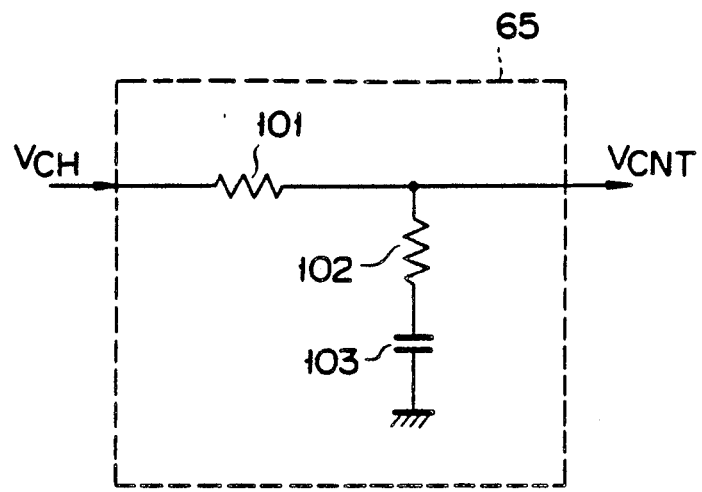
F I G. 12
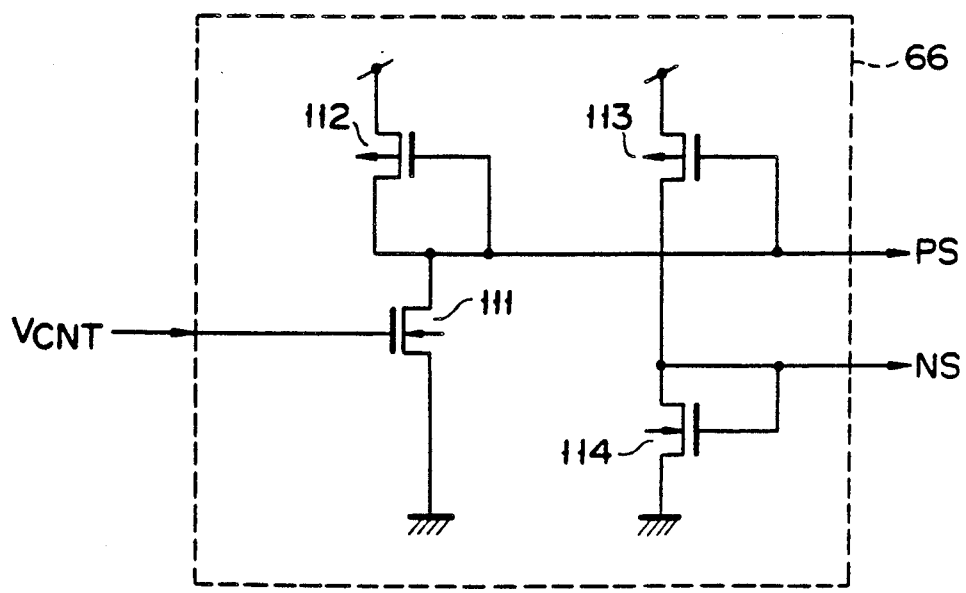
F I G. 13

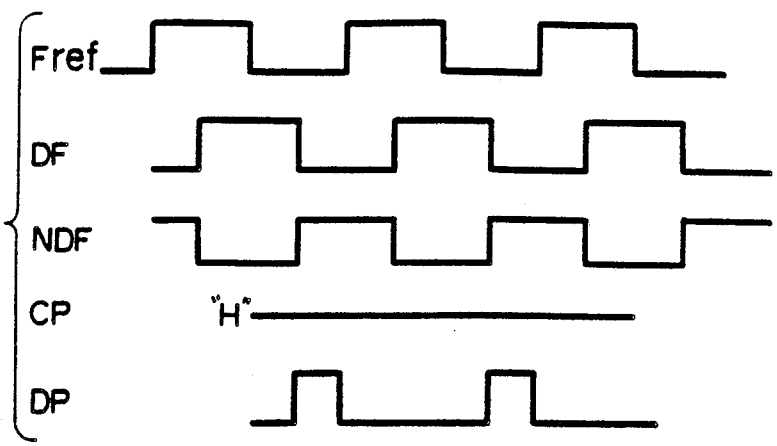
F.I G. 14
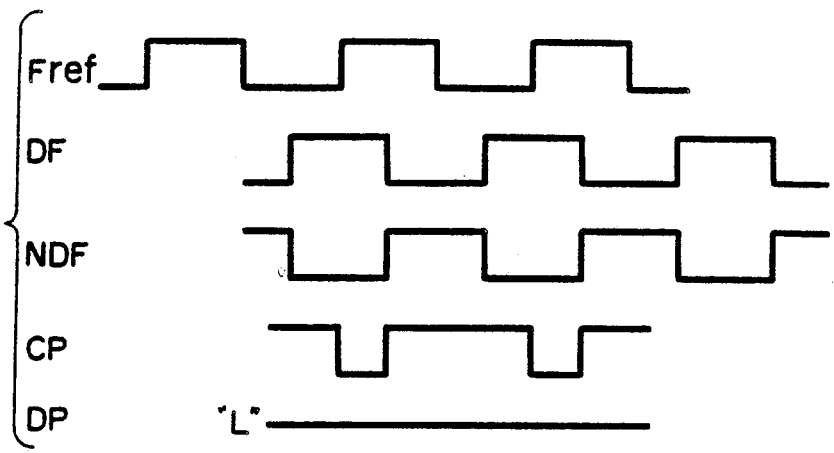
F I G. 15
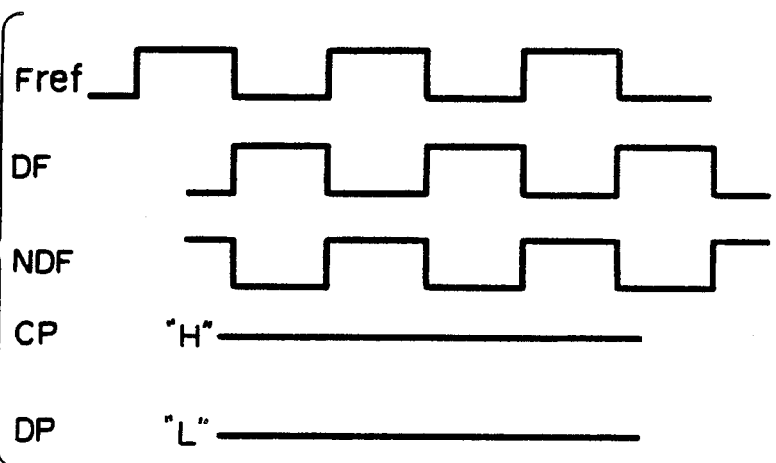
F I G. 16

RETRIGGERABLE MULTIVIBRATOR

BACKGROUND OF THE INVENTION

1. Field of the Invention

The present invention relates to a monostable circuit as a semiconductor circuit and, in particular, a retriggerable multivibrator (retriggerable monostable circuit).

2. Description of the Related Art

As an example of a conventional retriggerable multivibrator of this type is the Toshiba product type "TC74HC4538P/F" as shown in FIG. 1, with associated operation waveforms shown in FIG. 2. In the circuit of FIG. 1, C and R represent a capacitor and resistor, respectively, which are connected external to an integrated circuit. The conventional retriggerable multivibrator has an input A triggered by a rise edge of an input and an input 8 triggered by a fall edge of an input and complementary outputs Q, $\bar{Q}$. Output Q, an output Q goes high when the input A rises when the input $\bar{B}$ is at a high level is and the input CDH at a high level H. In this case, an internal switch connected to node T2 is turned ON, lowering a potential on the node T2 (releasing a charge on capacitor C), which has heretofore been held at a power source voltage Vcc level. The internal switch is turned OFF when the potential on the node T2 reaches a low level (L) reference input potential Vref. At this time, a charging current flows from the Vcc node into a circuit of a resistor R and capacitor C and the potential on the node T2 rises due to the time constant of the aforementioned circuit. When the potential on the node T2 reaches a high level reference input potential Vref (H), the output Q is reset to a low level. That is, the output Q delivers a pulse of a predetermined width TW which is determined by the aforementioned capacitor C and resistor R.

When the input A rises during a period of time in which the output Q is in the high level (prior to being reset to the low level), then the internal switch is so controlled as to again charge the node T2 at that time. In this case, the pulse width TW of the output Q is extended as to correspond to TW+tr where tr is equal to a time from the first input A to the second input A. Upon the entry of the second input A, the preceding first input A is disregarded and the high level of the output Q continues over the time period TW from the time of a reentry of the input signal. Thus when the input A enters in a continuous fashion at a shorter period of time than the time period TW, the output Q is held at a high level.

The aforementioned conventional retriggerable multivibrator has its output pulse width TW controlled by the capacitor C and resistor R provided external to the integral circuit, but in spite of this general nature a greater number of component parts need to be mounted on a printed circuit board. This presents a problem of requiring a greater mounting area, more manufacturing steps, etc. Furthermore, the retriggerable multivibrator per se requires two voltage comparators for comparing the voltage on the node T2 with the reference input voltage Vref (L) or Vref (H), further complicating the circuit layout.

SUMMARY OF THE INVENTION

It is accordingly the object of the present invention to provide a retriggerable multivibrator which, eliminates the need for associated external component parts, requires less mounting area and components while providing an accurate output pulse width.

According to the present invention, a retriggerable multivibrator is provided which comprises a first delay circuit for delaying an input signal a predetermined time period, a second delay circuit connected for receiving an output of the first delay circuit and having an enable or a disable function, a flip-flop circuit connected to be set or reset in accordance with an input signal and output signal of the second delay circuit, and a control circuit connected to detect the reentry of the input signal within a predetermined delay time period so that the second delay circuit is enable or disable.

The flip-flop circuit is set by the rise edge of the input signal and reset when it receives the input signal via first and second delay circuits. It is, therefore, possible to obtain an output pulse width TW which is equal to the delay time of both first and second delay circuits.

If the flip-flop circuit receives a reentry signal during the time period in which the flip-flop circuit is set by the first input signal, then the second delay circuit is enable or disable based on the detection of that second input signal and, as a result, there is a disappearance of a reset input to the flip-flop circuit. In this case, a reset input is generated after a delay time has been achieved for the second input signal at the location of both the delay circuits. It is, therefore, possible to extend the output width. As a result, the flip-flop circuit continues to be set during a continuous entry of an input signal at a shorter time interval than the output pulse width TW.

According to the retriggerable multivibrator of the present invention, since the output pulse width is determined by the delay time of the internal delay circuit, it is not necessary to connect any external capacitor and resistor for determination of an output pulse width to an integrated circuit. Hence, the multivibrator can readily be mounted on a printed circuit board without increasing the mounting area.

The multivibrator of the present invention obviates the necessity of providing a voltage comparator as required in the conventional counterpart. The present multivibrator includes, as main constituent elements, a flip-flop circuit, delay circuits and logical circuits for delay circuit control (set or reset). According to the present invention a circuit design can readily be achieved with the use of less component parts. The output pulse width can be precisely controlled by setting or controlling the delay time.

BRIEF DESCRIPTION OF THE DRAWINGS

FIG. 5 is an operation timing chart of the retriggerable multivibrator of FIG. 3;

FIG. 6 shows a retriggerable multivibrator of the present invention employing a set-priority type set/reset flip-flop circuit;

FIG. 7 is an operation timing chart of the retriggerable multivibrator of FIG. 6;

FIG. 8 is a circuit diagram showing a retriggerable multivibrator according to another embodiment of the present invention in which circuit parts are initialized by a clear signal upon the turning on of a power source;

FIG. 10 shows a basic circuit block of a delay circuit in a retriggerable multivibrator of the present invention, which is shown in FIG. 9;

FIG. 11 is a practical circuit diagram showing a phase comparator and charge pump circuit in the retriggerable multivibrator of the present invention, which is shown in FIG. 9;

FIG. 12 is a practical circuit diagram showing a low pass filter in the retriggerable multivibrator of the present invention, which is shown in FIG. 9;

FIG. 13 is a practical circuit diagram of a level converter in the retriggerable multivibrator of the present invention, which is shown in FIG. 9;

FIG. 14 is an operation timing chart of a phase locked loop in the retriggerable multivibrator of the present invention, which is shown in FIG. 9;

FIG. 15 is an operation timing chart of a phase locked loop in the triggerable multivibrator of the present invention, which is shown in FIG. 9; and FIG. 16 is an operation timing chart of a phase locked loop in a retriggerable multivibrator of the present invention which is shown in FIG. 9.

DETAILED DESCRIPTION OF THE PREFERRED EMBODIMENT

A retriggerable multivibrator according to an embodiment of the present invention will be explained below with reference to the drawings.

Figure 1:
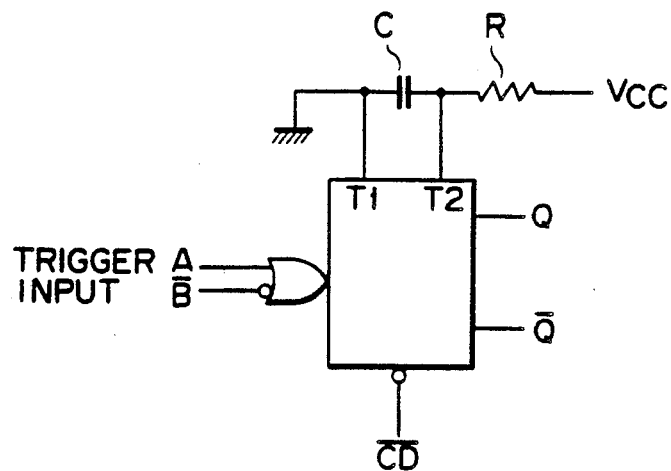
FIG. 1 is a circuit diagram showing a conventional retriggerable multivibrator.
Figure 2:
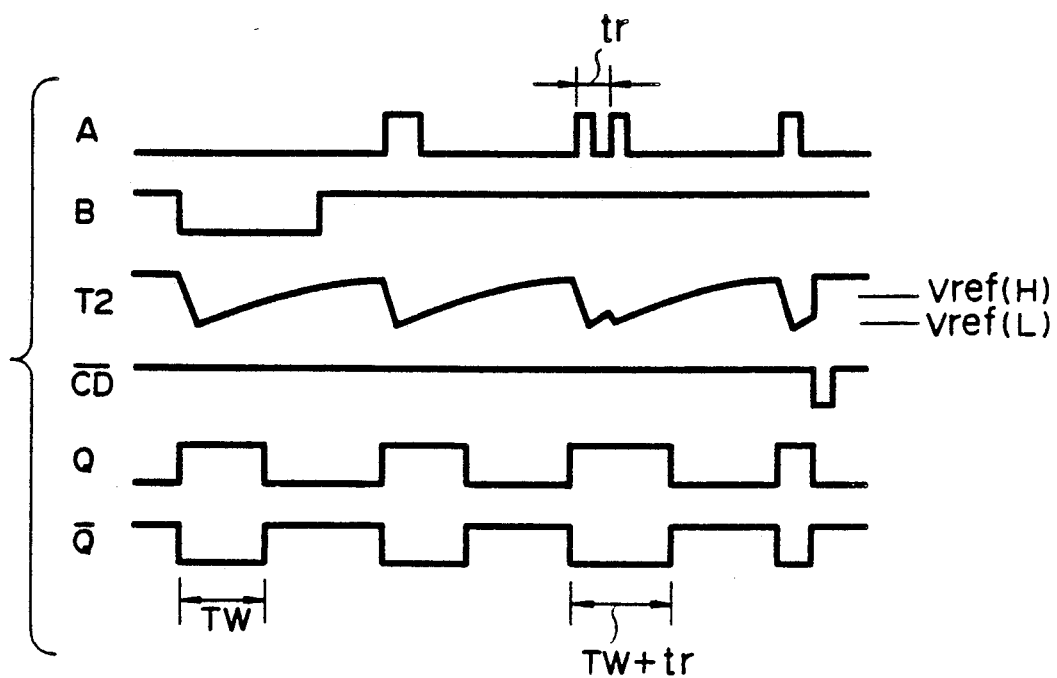
FIG. 2 is an operation timing chart of a conventional retriggerable multivibrator of FIG. 1.
Figure 3:
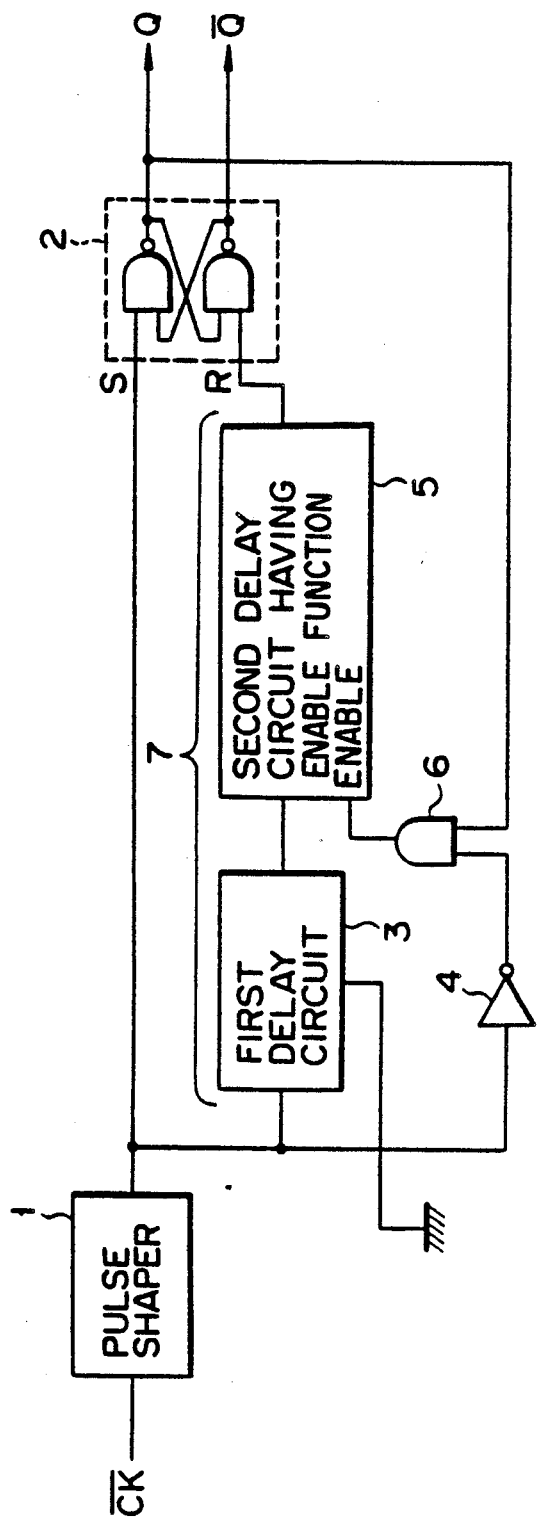
FIG. 3 is a circuit diagram showing a retriggerable multivibrator according to an embodiment of the present invention.

FIG. 3 shows a retriggerable multivibrator as a semiconductor circuit of the present invention.

In FIG. 3, pulse shaper 1 shapes an input clock $\overline{CK}$ into a pulse and an output of pulse shaper 1 is delivered to a set input S of set/reset (SR) type flip-flop circuit 2. At the same time, the output of pulse shaper 1 is input to first delay circuit 3 and inverter circuit 4. The output of first delay circuit 3 is input to, for example, set function-equipped second delay circuit 5. The output of second delay circuit 5 is input to the reset input R of flip-flop circuit 2. The set output Q of flip-flop circuit 2 and output of inverter circuit 4 are input to two-input AND circuit 6. The output of AND circuit 6 is input to set input SET of second delay circuit 5.

Figure 4:
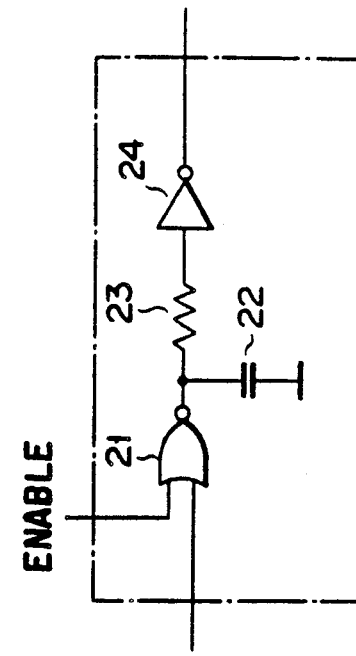
FIG. 4 shows a practical circuit of a delay circuit in the multivibrator of FIG. 3.

Second delay circuit 5 is of such a type that a requisite number of basic circuit blocks corresponding to a delay time of second delay circuit 5 are cascade-connected with the basic circuit block having an arrangement as shown, for example, in FIG. 4. In the arrangement shown in FIG. 4, the output of first delay circuit 3 and enable input ENABLE of AND circuit 6 are input to two-input NOR circuit 21 with capacitor 22 connected between the output of NOR circuit 21 and ground terminal. The output of NOR circuit 21 is connected to inverter circuit 24 through resistor 23. First delay circuit 3 is of such a type that a requisite number of basic circuit blocks corresponding to a delay time of first delay circuit 3 are cascade-connected with the basic circuit block having an arrangement as shown in FIG. 4, but a fixed level input (the low level in the present embodiment) is supplied to first delay circuit 3 in place of the enable input ENABLE.

The operation of the circuit of FIG. 3 will be explained below with reference to FIG. 5.

The input clock $\overline{CK}$ is shaped by pulse shaper 1 into a predetermined pulse width. If the input clock $\overline{CK}$ has a proper pulse width then pulse shaper 1 can be omitted. An explanation will be given below with regard the case where an input clock $\overline{CK}$ (a "shaped" clock) has a pulse time interval trr greater than a predetermined output pulse width TW of the set output Q of the flip-flop circuit. The output pulse width TW is determined by first and second delay circuits 3 and 5. Flip-flop circuit 2 is set by a fall edge of the input clock $\overline{CK}$ and the corresponding output Q becomes a high level. The output Q and inverted replica (from inverter 4) of the input clock $\overline{CK}$ are supplied to AND circuit 6 and the output of AND circuit 6 is input to the enable input ENABLE of delay circuit 5. As a result, second delay circuit 5 is enable, eliminating the previous input clock which already has been input to second delay circuit 5 before the inputting of the present input clock $\overline{CK}$. The clock $\overline{CK}$ which is input to first delay circuit 3 is supplied via second delay circuit 5 to flip-flop circuit 2, while being delayed for a predetermined time period, causing flip-flop circuit 2 to be reset. As a result, the output Q of flip-flop circuit 2 becomes a low level.

When the input clock $\overline{CK}$ becomes a low level during the time period in which the output Q is at a high level, the output of inverter circuit 4 becomes a high level and the enable input ENABLE is input to second delay circuit 5, causing second delay circuit 5 to be enable. If at this time the delay time of first delay circuit 3 is somewhat delayed behind the pulse time interval trr of the input clock $\overline{CK}$ a in the passing of the input clock $\overline{CK}$ through the requisite number of basic circuit blocks in first delay circuit 3, then the input clock $\overline{CK}$ never disappears within delay circuit array 7. As a result, the output Q goes high for a period of time (a time width) TW which is equal to a sum of the delay times of first and second delay circuits 3 and 5.

An explanation will now be given below about the case where an input clock $\overline{CK}$ is input to flip-flop circuit 2 within the pulse width TW after the input clock $\overline{CK}$ has been input to flip-flop circuit 2. In this case, upon the inputting of the second input clock $\overline{CK}$ to flip-flop circuit 2 the input clock $\overline{CK}$ is also input to inverter circuit 4 and hence the output of inverter circuit 2 goes high. Since the output Q of flip-flop circuit 2 is already at a high level due to the reception of the second input clock $\overline{CK}$, the output of AND circuit 6 goes high, enabling second delay circuit 5. The enabling of second delay circuit 5, if done, eliminates the start input clock $\overline{CK}$ passing within second delay circuit 5. As a result, the start input clock $\overline{CK}$ is not output of flip-flop circuit 2 and flip-flop circuit 2 is not reset by the start input clock $\overline{CK}$. After the time width TW following the time at which the second input clock $\overline{CK}$ is input to flip-flop circuit 2, that is, after a sum of the delay times of first and second delay circuits 3 and 5, flip-flop circuit 2 is reset due to a delay of the second input clock $\overline{CK}$. If subsequent to inputting the first input clock $\overline{CK}$ as a set input S to flip-flop circuit 2 the input clock $\overline{CK}$ continues to be input for a shorter time period than the pulse width TW, the input clock $\overline{CK}$ in second delay circuit 5 continues to be eliminated in the manner set forth above. Thus flip-flop circuit 2 continues to be set without being reset. The pulse width TW can readily be varied by, for example, using a digital control system for a plurality of basic circuit blocks, or a master slice system for some of a plurality of series-connected basic circuit blocks connected to the associated aluminum wires, so as to attain a requisite number of "basic circuit block" stages.

If it is not known whether, upon the simultaneous inputting of the set input S (input clock $\overline{CK}$) and reset input R (delayed input clock $\overline{CK}$), flip-flop circuit 2 is set or reset, there is possibility that the flip-flop will be operated erroneously. In order to prevent the operation error of flip-flop circuit 2, it is only necessary to employ a set-priority type set/reset flip-flop circuit 42 as shown in FIG. 6. Flip-flop circuit 42 as shown in FIG. 6 responds to the rise edge of the input clock $\overline{CK}$. In FIG. 6, reference numeral 41 shows a pulse shaper; 43, a first delay circuit; 46, an AND circuit for reentry input clock detection; and 47, a delay circuit section. FIG. 7 shows one form of an operation of each part of the circuit shown in FIG. 6.

In the respective embodiments of FIGS. 3 and 6, there is a risk that a noise output will be input as a reset input from delay circuit array (7, 47) into flip-flop circuit (2, 42) due to a noise input to the flip-flop circuit upon the supply of a power source voltage to the integrated circuit. In order to avoid such a situation, it is necessary to initialize respective associated circuits with a clear signal CLR developed at the time of supplying the power source voltage to the circuit as shown in FIG. 8. Upon comparison the circuit of FIG. 8 is different from that of FIG. 6 in that pulse shaper 51 and first delay circuit 53 have the disable function. Furthermore, flip-flop circuit 52 in the circuit of FIG. 8 has a "clear" function. A difference is also noted in that, in the circuit shown in FIG. 8, second NAND circuit 58 receives an inverted signal from inverter circuit 54 and output of reentry clock detector to allow the output of NAND circuit 58 to be supplied as a disable input DISABLE to second delay circuit 55. Here as the reentry clock detector use is made of first NAND circuit 56. As set out above, second NAND circuit 58 receives the output of first NAND circuit 56 and an inverted replica of the clear signal CLR, coming from inverter circuit 54. The output of NAND circuit 58 is supplied to the disable input DISABLE.

In the respective embodiments of FIGS. 3, 6 and 8, an output pulse width TW at a normal inputting time can be controlled by varying the delay time of the delay circuit.

Figure 9:
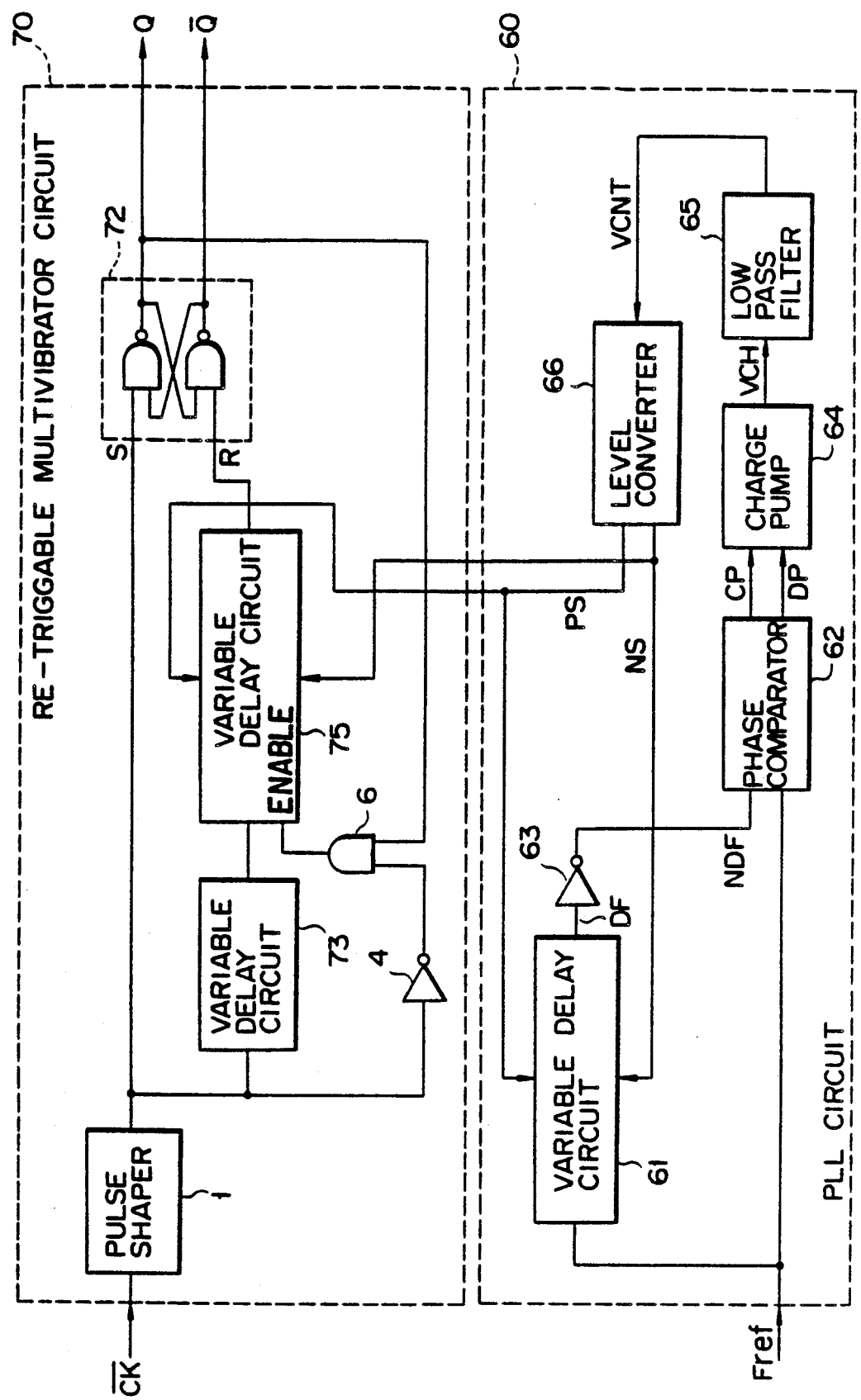
FIG. 9 is a circuit diagram showing a retriggerable multivibrator according to another embodiment of the present invention which can exactly control a delay time of a delay circuit employing a phase locked loop.

FIG. 9 shows set function-equipped variable delay circuit 75 as a second delay circuit in which case the output pulse width TW can be controlled by varying the frequency or cycle of a reference function Fref. The circuit arrangement shown in FIG. 9 is constructed of retriggerable multivibrator circuit 70 and phase locked loop (PLL) circuit 60. In the retriggerable multivibrator circuit, second delay circuit 5 of FIG. 3 is replaced by variable delay circuit 75 and PLL circuit is adapted to precisely control the delay time of variable delay circuit 75. PLL circuit 60 receives a signal of a reference frequency Fref and the delay time of variable delay circuit 61 in the loop is feed-back controlled, so as to be constant: for example, one half the cycle of the reference frequency Fref. That is, the input reference frequency Fref is supplied to variable delay circuit 61 and to one input of phase comparator 62. The output DF of variable delay circuit 61 is supplied via inverter circuit 63 to the other input of phase comparator 62. Phase comparator 62 compares two inputs in terms of their phase relation and controls a first output CP or second output DP in accordance with a result of comparison. The outputs CP, DP are supplied to charge pump circuit 64, the output of which is supplied to low pass filter 65. The low pass filter delivers an output signal to level converter 66. The level converter is adapted to control the potentials of first and second outputs PS and NS in accordance with the input level. The outputs PS and NS are supplied as a delay amount control input to variable delay circuit 61 and as a delay amount control input to variable delay circuit 75 in retriggerable multivibrator circuit 70.

Variable delay circuits 61 and 75 are of such a type that each is constituted by a requisite number of cascade-connected basic circuit blocks, for example, as shown in FIG. 10. That is, an input signal is supplied via first CMOS transfer gate 81 to one input of NOR gate 82. The NOR gate also receives a enable input and delivers an output to second CMOS transfer gate 83, the output of which is delivered via inverter circuit 84. CMOS transfer gates 81 and 83 are each formed of P- and N-channel transistors in parallel with each other with delay amount control inputs PS and NS applied to their gates. Thus, CMOS transfer gates 81 and 83 have their resistive component varied in accordance with the delay amount control inputs PS and NS, hence the delay amount varies.

First delay circuit 73 in retriggerable multivibrator array 70 is comprised of a requisite number of cascade-connected basic circuit blocks, one of which is shown in FIG. 10, and has no set function because a fixed level, for example, a low level, is applied as an enable input ENABLE with the control input level of CMOS transfer gates 81 and 83 fixed.

FIG. 11 shows one example of phase comparator 62 and charge pump circuit 64. An input Fref is supplied as a clock input $\overline{CK}$ to first D type flip-flop 91 and the output NDF of inverter 63 in FIG. 9 is supplied as a clock input $\overline{CK}$ to D type flip-flop 92. Respective outputs Q of flip-flop 91 and 92 are input to AND gate 93 and the output of AND gate 93 is supplied to the reset inputs R of both flip-flop circuits 91 and 92. The output Q of first flip-flop circuit 91 is supplied as a first output CP to P-channel transistor via inverter circuit 94 and the output Q of second flip-flop circuit 92 is supplied as a second output DP to N-channel transistor 96.

Charge pump circuit 64 is made up of a series circuit of P- and N-channel transistors 95 and 96 which is connected across a power source voltage (Vcc) terminal and ground. The outputs CP and DP of phase comparator 62 are input to the gates of transistors 95 and 96.

Low pass filter 65 includes resistors 101 and 102 and capacitor 103 as shown, for example, in FIG. 12.

Level converter 66 is constituted by, as shown in FIG. 13, N-channel transistor 111 supplied at its gate with an input VCNT from low-pass filter 65, P-channel transistor 112 having its gate connected to its drain and serving as a load for transistor 111, P-channel transistor 113 having its gate connected to a junction between the drains of both transistors 112 and 111, and N-channel transistor 114 having its gate connected to its drain and serving as a load for transistor 113, in which the first and second outputs PS and NS are delivered from the respective drains of N-channel transistors 111 and 112.

The operation of PLL circuit 60 as shown in FIG. 9 will be explained below.

When the delay time of the delay circuit 61 which, to be exact, includes a delay time of inverter circuit 63 is shorter than T/2 (T: the cycle of the input Fref.), the first output CP of phase comparator 62 becomes a predetermined high (H) level and the second output DP becomes a high level by an extent corresponding to that shorter delay time so that a discharge pulse is generated. Thus charge pump circuit 64 is discharged, then an output (VCNT) voltage of low pass filter 65 is lowered. Here if Vref = a predetermined potential (for example, Vcc/2), the potential of the first output PS and that of the second output NS are raised and lowered, respectively, in level converter 66, causing a greater delay time in variable delay circuit 61.

If, on the other hand, the delay time of variable delay circuit 61 is longer than T/2 as shown in FIG. 15, the second output DP of phase comparator 62 becomes a predetermined low (L) level and first output CP becomes a low level by an extent corresponding to that longer time so that a charge pulse is produced. Charge pump circuit 64 is charged up, raising the potential of the output VCNT of low pass filter 65. This causes a fall of the first output PS of level converter 66 and a rise of the second output NS, resulting in a shorter delay time of variable delay circuit 61.

If, as shown in FIG. 16, the delay circuit of variable delay circuit 61 becomes equal to T/2 to achieve a phase-locked state, then the outputs CP and DP of phase comparator 62 are both at a constant level so that neither a discharge nor a charge pulse is developed. As a result, the outputs PS and NS of level converter 66 are both at a constant level and hence a constant delay amount is involved in variable delay circuit 61. It is, therefore, possible to precisely control the delay time of the variable delay circuit.

As set out above, PLL circuit 60 can vary the delay times of variable delay circuits 61, 73 and 75 by varying the cycle of the input Fref. It is possible to vary the output pulse width TW of retriggerable multivibrator circuit 70. If the input Fref is 2 MHz in the case where the basic circuits as shown, for example, in FIG. 9 are a 16-stage type including first variable delay circuit 73 and second variable delay circuit 75 in retriggerable multivibrator circuit 70 in combination with variable delay circuit 61 of an 8-stage in PLL circuit 60, then the pulse width TW of multivibrator circuit 70 becomes $$31.3 \times 16 = 500 \ ns,$$

provided that control is made by PLL circuit 60 to achieve a delay time of about 31.3 ns per stage. If the input Fref is 1 MHz, the delay time per stage is about 62.5 ns and the output pulse width TW of retriggerable multivibrator circuit is 1 μs. Let is be assumed that the input Fref is applied in a frequency-divided form, that is a form obtained by frequency-dividing a clock output of a crystal oscillator, not shown. In this case, the output pulse width TW of retriggerable multivibrator circuit 70 can be varied by varying the number of frequencies thus divided, that is, by varying the number of divided frequencies.

The circuit of FIG. 9 can readily be designed because a basic delay circuit of the same constant is employed for the delay circuit of retriggerable multivibrator circuit and for that of PLL circuit, but it is not necessarily required that the basic delay circuit be comprised of one having the same constant. Although in the embodiment shown in FIG. 9 the second delay circuit of multivibrator circuit 70 has been explained as being a variable delay circuit, the present invention is not restricted thereto. For example, at least one of first and second delay circuits may be formed as a variable one.

What is claimed is:

1. A retriggerable multivibrator comprising:
   a flip-flop circuit which is set in accordance with an input signal;
   a first delay circuit, which receives said input signal and outputs said input signal after a first predetermined delay time interval;
   a second delay circuit which receives said input signal output from said first delay circuit and an enable signal, and which outputs said input signal to said flip-flop circuit after a second predetermined delay time interval, so as to reset said flip-flop circuit; and
   control circuit means connected to an output of said flip-flop circuit for enabling said second delay circuit when a subsequent input signal is input to said flip-flop circuit during a time period when said flip-flop circuit is not reset.

2. A retriggerable multivibrator according to claim 1, wherein at least one of said first delay circuit and said second delay circuit comprises a variable delay circuit.

3. A retriggerable multivibrator according to claim 2, further comprising a phase locked loop which is phase locked to a reference frequency, including a level converter for controlling a delay amount of said variable display circuit.

4. A retriggerable multivibrator according to claim 1, wherein said flip-flop circuit comprises a set-priority type set-reset flip-flop circuit.

5. A retriggerable multivibrator according to claim 1, wherein said first delay circuit, said second delay circuit and said flip-flop circuit are initialized by a clear signal which is generated upon the turning on of a power source voltage.

6. A retriggerable multivibrator according to claim 1, wherein said input signal has a predetermined time period, and wherein said first predetermined delay time interval is longer than said predetermined time period of said input signal.

7. A retriggerable multivibrator comprising:
   a flip-flop circuit which is set in accordance with an input signal;
   a first delay circuit, which receives said input signal and outputs said input signal after a first predetermined delay time interval;
   a second delay circuit which receives said input signal output from said first delay circuit and a disable signal, and which outputs said input signal to said flip-flop circuit after a second predetermined delay time interval, so as to reset said flip-flop circuit; and
   control circuit means connected to an output of said flip-flop circuit for disabling said second delay circuit when a subsequent input signal is input to said flip-flop circuit during a time period when said flip-flop circuit is not reset.

8. A retriggerable multivibrator according to claim 7, wherein at least one of said first delay circuit and said second delay circuit comprises a variable delay circuit.

9. A retriggerable multivibrator according to claim 8, further comprising a phase locked loop which is phase locked to a reference frequency, including a level converter for controlling a delay a amount of said variable delay circuit.

10. A retriggerable multivibrator according to claim 7, wherein said flip-flop circuit comprises a set-priority type set-reset flip-flop circuit.

11. A retriggerable multivibrator according to claim 7, wherein said first delay circuit, said second delay circuit and said flip-flop circuit are initialized by a clear signal which is generated upon the turning on of a power source voltage.

12. A retriggerable multivibrator according to claim 7, wherein said input signal has a predetermined time period, and wherein said first predetermined delay time interval is longer than said predetermined time period of said input signal.

* * * * *

UNITED STATES PATENT AND TRADEMARK OFFICE
CERTIFICATE OF CORRECTION

PATENT NO. : 4,994,687

DATED : February 19, 1991

INVENTOR(S) : Shinji Fujii et al.

It is certified that error appears in the above-identified patent and that said Letters Patent is hereby corrected as shown below:

In the Abstract, line 5, after "having" change "a" to --an--.

Claim 3, column 8, line 28, change "display" to --delay--.

Claim 9, column 8, line 64, after "delay" delete "a".

Signed and Sealed this

Twentieth Day of April, 1993

*Attest:*

MICHAEL K. KIRK

*Attesting Officer*  *Acting Commissioner of Patents and Trademarks*